US010361704B2

(12) United States Patent
Yorita

(10) Patent No.: US 10,361,704 B2
(45) Date of Patent: Jul. 23, 2019

(54) OSCILLATOR

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 74 days.

(21) Appl. No.: 15/300,795

(22) PCT Filed: Mar. 20, 2015

(86) PCT No.: PCT/JP2015/058523
§ 371 (c)(1),
(2) Date: Sep. 30, 2016

(87) PCT Pub. No.: WO2015/151870
PCT Pub. Date: Oct. 8, 2015

(65) Prior Publication Data
US 2017/0019111 A1    Jan. 19, 2017

(30) Foreign Application Priority Data

Mar. 31, 2014  (JP) ................................ 2014-074456
Mar. 9, 2015   (JP) ................................ 2015-045761

(51) Int. Cl.
*H03B 5/32*    (2006.01)
*H03L 1/02*    (2006.01)
(Continued)

(52) U.S. Cl.
CPC ............... *H03L 1/04* (2013.01); *H03B 5/32* (2013.01); *H03L 1/027* (2013.01); *H03L 1/028* (2013.01); *H03L 7/08* (2013.01); *H03L 7/24* (2013.01)

(58) Field of Classification Search
CPC ......... H01L 2924/00; H01L 2924/1461; H01L 2224/49175; H03B 5/04; H03B 5/1228;
(Continued)

(56) References Cited

U.S. PATENT DOCUMENTS 7,427,902 B2 *   9/2008  Matsuoka ............... H03B 5/04
                                              331/158
7,764,133 B1 *   7/2010  Nicholls ................ H03L 1/022
                                              331/176

(Continued)

FOREIGN PATENT DOCUMENTS

CN    102916652    2/2013
JP    S53-068154   6/1978
(Continued)

OTHER PUBLICATIONS

"International Search Report (Form PCT/ISA/210)", dated Jun. 9, 2015, with English translation thereof, pp. 1-4.
(Continued)

*Primary Examiner* — Arnold M Kinkead
(74) *Attorney, Agent, or Firm* — JCIPRNET

(57) ABSTRACT

Providing an OCXO having a highly stabilized output frequency. In an oscillator, which is an OCXO, crystal resonators, oscillator circuits, a temperature detector, and a heater circuit are disposed inside a first container, which is supported in a state of floating inside a second container, while a voltage stabilizer circuit for stabilizing a supply voltage supplied to the heater circuit is disposed apart from the first container inside the second container. Therefore, the supply voltage supplied to the heater circuit is stabilized. The voltage stabilizer circuit is less likely to be affected by heat generation of the heater circuit, thus obtaining a stable oscillation frequency output regardless of the environmental temperature.

4 Claims, 4 Drawing Sheets

(51) Int. Cl.
*H03L 1/04* (2006.01)
*H03L 7/08* (2006.01)
*H03L 7/24* (2006.01)

(58) Field of Classification Search
CPC .... H03B 5/364; H03B 5/1215; H03B 5/1212; H03B 5/366; H03B 5/32; H03L 7/08; H03L 1/028; H03L 1/027; H03L 7/24; H03L 1/04
USPC .................................. 331/176, 158, 74, 175
See application file for complete search history.

(56) References Cited

U.S. PATENT DOCUMENTS

| | | | |
|---|---|---|---|
| 2006/0192626 | A1 | 8/2006 | Milliren et al. |
| 2006/0237426 | A1 | 10/2006 | Matsuoka |
| 2013/0033332 | A1 | 2/2013 | Akaike et al. |
| 2014/0132361 | A1* | 5/2014 | Yorita ....................... H03L 1/04 331/69 |

FOREIGN PATENT DOCUMENTS

| | | |
|---|---|---|
| JP | 2000-261248 | 9/2000 |
| JP | 2004-048686 | 2/2004 |
| JP | 2005-223395 | 8/2005 |
| JP | 2006-295570 | 10/2006 |
| JP | 2010-213102 | 9/2010 |
| JP | 2013-051676 | 3/2013 |
| JP | 2013-175864 | 9/2013 |
| JP | 2013-193051 | 9/2013 |
| JP | 5368154 | 12/2013 |

OTHER PUBLICATIONS

"Office Action of China Counterpart Application", dated Jun. 29, 2018, p. 1-p. 8.

"Office Action of China Counterpart Application," with machine English translation thereof, dated Mar. 29, 2019, pp. 1-18.

* cited by examiner

OSCILLATOR

CROSS-REFERENCE TO RELATED APPLICATION

This application is a 371 of international application of PCT application serial no. PCT/JP2015/058523, filed on Mar. 20, 2015, which claims the priority benefits of Japan application no. 2014-074456, filed on Mar. 31, 2014, and Japan application no. 2015-045761, filed on Mar. 9, 2015. The entirety of each of the above-mentioned patent applications is hereby incorporated by reference herein and made a part of this specification.

TECHNICAL FIELD

The present invention relates to an oscillator that detects a temperature in which a resonator, for example, a crystal resonator is placed to stabilize an output frequency on the basis of the temperature detection result.

BACKGROUND ART

As an oscillator that uses a crystal resonator, for example, an OCXO (Oven Controlled Xtal Oscillator), which is an oscillator with an oven, is configured to heat an atmosphere in which the crystal resonator is placed to a constant temperature with a heater such that the temperature of the crystal resonator is not affected by an external temperature variation. As a technique that aimed to improve temperature control accuracy of the heater, there is known a method for using two crystal resonators as temperature sensors to obtain a signal value corresponding to a temperature detection value calculated by using a frequency difference between the two crystal resonators, and controlling an output power of the heater on the basis of this signal value (Patent Document 1).

On the other hand, a frequency relative to a temperature of an oscillator, for example in a system that transmits a radio wave from a base station to a terminal, requires a much higher stability not only in the base station but even in a relay station. Patent Document 2 discloses that a temperature compensation type crystal controlled oscillator 1 is driven by using a voltage regulator, however, a configuration of the present invention is not disclosed.

CITATION LIST

Patent Document

Patent Document 1: Japanese Unexamined Patent Application Publication No. 2013-51676
Patent Document 2: Japanese Unexamined Patent Application Publication No. 2000-261248

SUMMARY

Problems to be Solved by the Invention

The present invention has been made under such situations, and the purpose thereof is to provide a technique that ensures a stabilized oscillation frequency output in an oscillator that uses a heater circuit to stabilize a temperature of an atmosphere in which a resonator is placed by stabilizing a heat generation amount of the heater circuit.

Solutions to the Problems

An oscillator of the present invention includes an oscillator circuit connected to a crystal resonator, and a heater circuit for stabilizing a temperature of an atmosphere in which the crystal resonator is placed. The oscillator includes a first substrate, a temperature detector, a second container, and a voltage stabilizer circuit. The first substrate is supported in a first container with a first supporting member in a state of floating from an inner wall of the first container. The temperature detector is configured to detect a temperature inside the first container, and a heater circuit whose supply electricity is controlled based on a temperature detection value of the temperature detector. The crystal resonator and the oscillator circuit are each disposed on the first substrate. The second container houses the first container in an internal space of the second container. The second container supports the first container in a state of floating from an inner wall of the second container via a supporting portion. The voltage stabilizer circuit is disposed apart from the first container in the second container, the voltage stabilizer circuit stabilizing a supply voltage supplied to the heater circuit.

Effects of the Invention

The present invention disposes, in an OCXO, a resonator inside a first container that is supported in a state of floating inside a second container, an oscillator circuit, a temperature detector, and a heater circuit, as well as a voltage stabilizer circuit for stabilizing a supply voltage supplied to the heater circuit apart from the first container inside the second container. Therefore, the voltage supplied to the heater circuit is stabilized, and the voltage stabilizer circuit is less likely to be affected by heat generation of the heater circuit, thereby obtaining a stable oscillation frequency output regardless of the environmental temperature.

DESCRIPTION OF PREFERRED EMBODIMENTS

Figure 1:
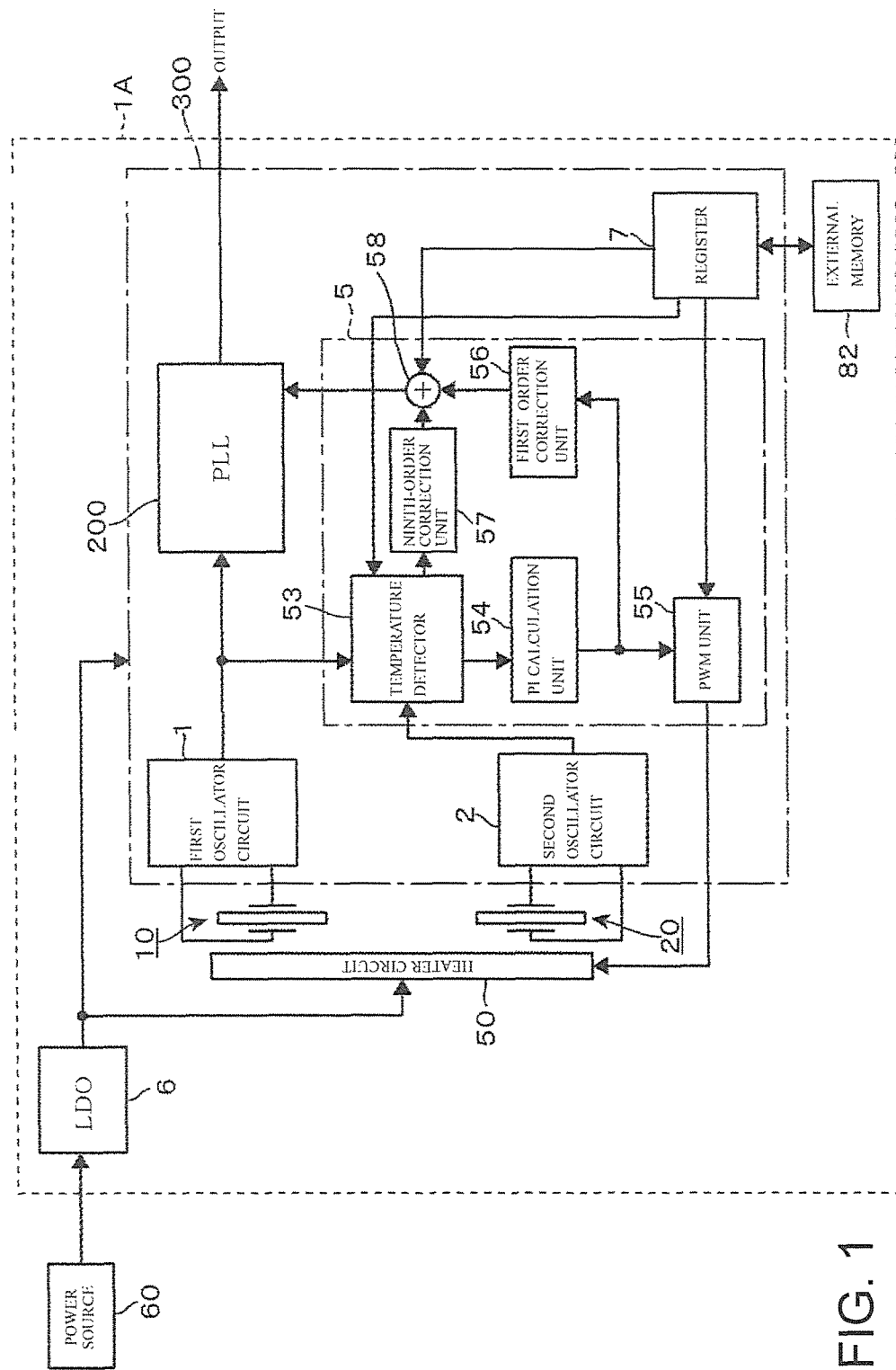
FIG. 1 is a block diagram illustrating an overall configuration of an oscillator according to the present invention.

FIG. 1 is a block diagram illustrating a whole oscillator 1A according to an embodiment of the present invention. The oscillator 1A includes a first crystal resonator 10, a second crystal resonator 20, and a first oscillator circuit 1 and a second oscillator circuit 2 that oscillate these crystal resonators. The first oscillator circuit 1 and the second oscillator circuit 2 are constituted of, for example, a Colpitts oscillation circuit.

Figure 2:
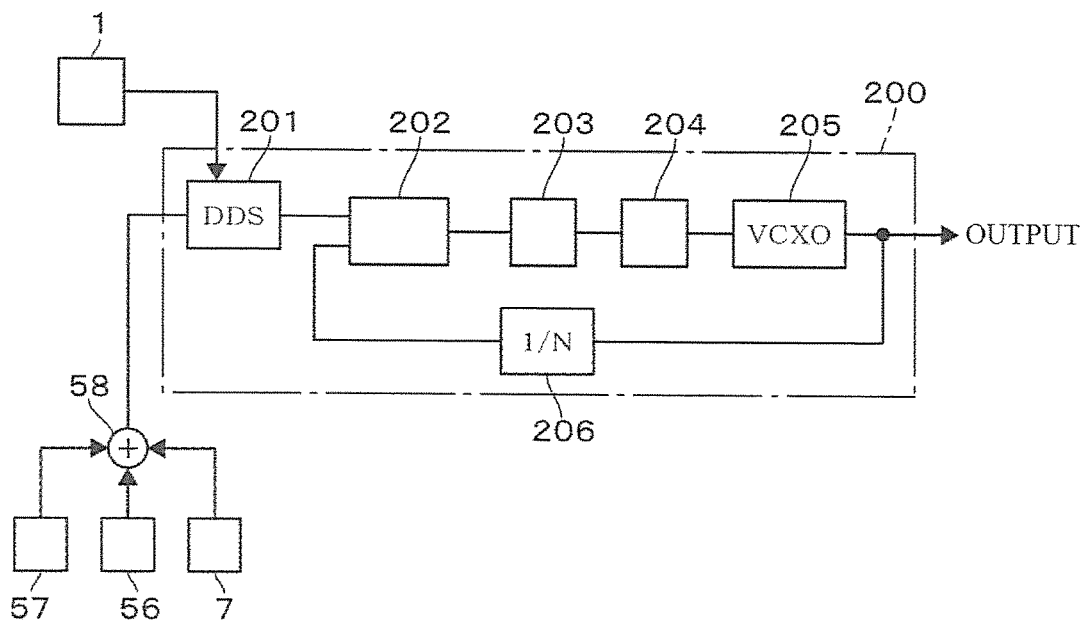
FIG. 2 is a block diagram illustrating a detail of a part of a circuit of the above-described oscillator.

A latter part side of the first oscillator circuit 1 and the second oscillator circuit 2 includes a PLL (Phase Locked Loop) circuit unit 200 and a DSP (Digital Signal Processor) block 5. Although the PLL circuit unit 200 is briefly illustrated as a block in FIG. 1, the PLL circuit unit 200 is constituted of circuits including a DDS (Direct Digital Synthesizer) 201 as illustrated in FIG. 2. An operation clock of the DDS 201 uses an oscillation output, which is output from the first oscillator circuit 1. A digital value corresponding to a setting frequency input to the DDS 201 is a value output from an addition unit 58 described below.

A frequency signal output from the DDS 201 is input to one of the input ports of a phase comparator 202. A frequency signal output from a voltage control oscillator 205 described below is divided at a frequency divider 206, and input to the other input port of the phase comparator 202. The phase comparator 202 detects a difference of phases of both the frequency signals, which is input to a charge pump 203. An output from the charge pump 203 is integrated with a loop filter 204, and the integral value is input to the voltage control oscillator 205 as a control voltage. That is, the PLL circuit unit 200 generates a frequency signal that becomes a reference frequency at the DDS 201, and constitutes the PLL using the frequency signal of this reference.

The DSP block 5 includes a temperature detector 53, a PI calculation unit 54, a PWM (Pulse width Modulation) unit 55, a first order correction unit 56, a ninth-order correction unit 57, and the addition unit 58. The temperature detector 53 operates a digital value $\Delta F$ that corresponds to a difference of an oscillation output f1 from the first oscillator circuit 1 and an oscillation output f2 from the second oscillator circuit 2 (f1-f2). $\Delta F$ is a value that corresponds to a temperature of an atmosphere in which the crystal resonators 10 and 20 are placed, which means that $\Delta F$ is a temperature detection value. Although the diagram does not illustrate, a latter part of the temperature detector 53 includes a circuit that operates how different the temperature detection value $\Delta F$ is from a setting temperature. This circuit obtains, for example, a difference between a temperature detection value and a setting temperature. The PI calculation unit 54 performs PI (differentiation and integration) calculation on this difference value, which is input to the PWM unit 55. The PWM unit 55 is to convert a digital value output from the PI calculation unit 54 to an analog signal. In view of this, a D/A (digital/analog) unit may be used instead of the PWM unit 55.

A latter part of the PWM unit 55 includes a heater circuit 50, and an output of the heater circuit 50 is controlled by an output of the PWM unit 55. The heater circuit 50 is disposed at proximity of the first crystal resonator 10 and the second crystal resonator 20 as described later. The heater circuit 50 includes a power transistor. The voltage stabilizer circuit 6 supplies a voltage to a collector of the power transistor. Then a base voltage of the power transistor is controlled by a control voltage from the PWM unit 55, and a supply electricity of the power transistor is adjusted. Accordingly, the output of the PI calculation unit 54 can be said to be a control signal to control the heater circuit 50.

The digital value, which is an output of the PI calculation unit 54, varies corresponding to the variation of the oscillation frequency of the crystal resonators 10 and 20, which means the digital value is also a value that corresponds to a temperature of the atmosphere in which the crystal resonators 10 and 20 are placed. In view of this, the output of the PI calculation unit 54 is input to the first order correction unit 56, and the PI calculation value is multiplied with a coefficient at the first order correction unit 56 to make the multiplication value to be a correction value of a frequency setting value described below.

On the other hand, the above-described $\Delta F$ obtained at the temperature detector 53 is input to the ninth-order correction unit 57. At the ninth-order correction unit 57, a frequency correction value relative to the frequency setting value is calculated from a ninth-order temperature characteristic curved line based on the temperature detection value $\Delta F$. This frequency correction value is for compensating the variation that the frequency of the operation clock of the DDS 201 varies corresponding to the temperature. In this example, a relation between the frequency and the temperature in the first crystal resonator 10 is approximated with a ninth-order function. Here, a part denoted as a reference numeral 7 in FIG. 1 is a register. In this register 7, a frequency setting value read from an external memory 82 is written as a digital value, and this frequency setting value is output to the addition unit 58. At the addition unit 58, a correction value from the ninth-order correction unit 57 and a correction value from the first order correction unit 56 are added to this frequency setting value.

With the correction value from the ninth-order correction unit 57, the oscillation frequency of the first crystal resonator 10 is corrected for the variation corresponding to the temperature variation. However, the temperature compensation of the oscillation frequency obtained from the voltage control oscillator 205 cannot be performed with high accuracy only with the correction value from the ninth-order correction unit 57, because characteristics of the peripherals such as the PLL circuit unit 200 and the DDS 201 also varies with the temperature. Therefore, in order to compensate the variation amount in the characteristics of the peripherals depending on their temperatures, the correction value obtained at the first order correction unit 56 is added to the frequency setting value at the addition unit 58.

Figure 3:
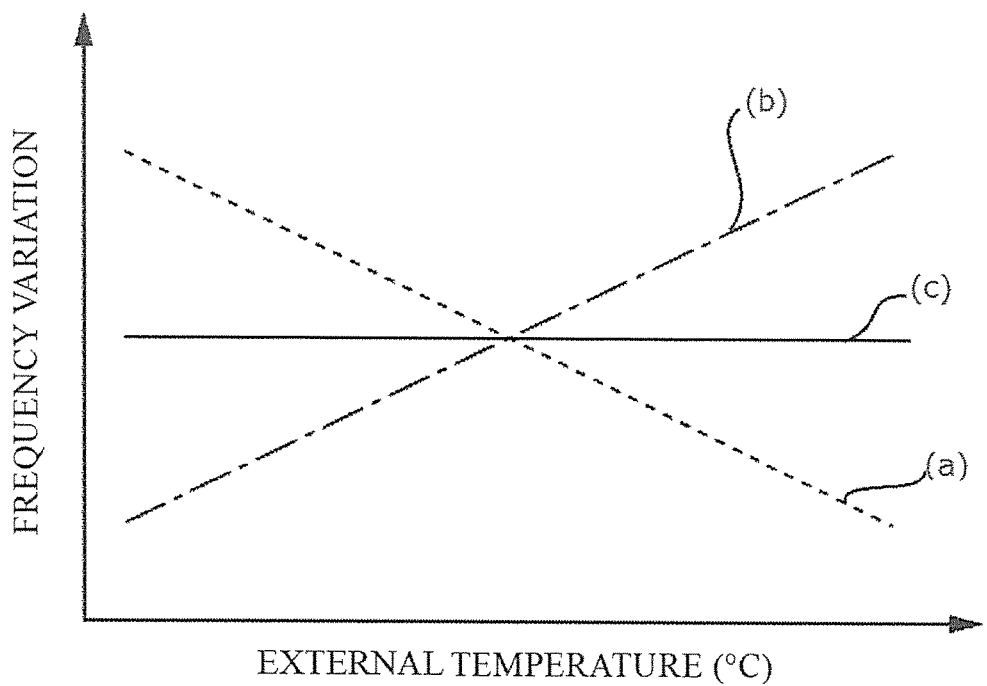
FIG. 3 is a frequency characteristic diagram schematically illustrating a relation between a temperature variation of peripherals and a variation rate of an oscillation frequency of an oscillator.

FIG. 3 is a graph schematically illustrating a role of correcting a setting frequency by the first order correction unit 56, and in the graph, the vertical axis indicates a variation rate of the output frequency of the voltage control oscillator 205 and the horizontal axis indicates the external temperature. A dotted line a indicates a variation rate of an output frequency (a value that divided the difference between an output frequency at a reference temperature and an output frequency at the temperature then by the output frequency of the reference temperature) of the voltage control oscillator 205, which is caused by the characteristics of the peripherals varying with the temperature. A chain line b indicates a variation rate of an output frequency of the voltage control oscillator 205 when a frequency correction value corresponding to an external temperature is output from the first order correction unit 56. As can be seen from this graph, the dotted line a and the chain line b are offset from one another, and the output frequency of the voltage control oscillator 205 is stabilized even though the characteristics of the peripherals vary with the temperature.

In this way, the output value from the addition unit 58 consequently becomes the frequency setting value to determine the reference frequency in the phase locked loop (PLL) of the PLL circuit unit 200. The DSP block 5, the PLL circuit unit 200, the register 7, and the frequency divider 206 are formed within one integrated circuit unit (LSI) 300. The external memory 82 stores each parameter for operating the oscillator 1A, for example, the parameter is read into the register 7 in the oscillator 1A when the power source of the oscillator 1A is turned on.

As described above, the oscillator 1A as an OCXO is also constituted as a TCXO. The oscillator 1A is configured as a device that ensures the stabilized output with high accuracy by performing a dual temperature control of the action of the heater circuit 50 and the frequency correction based on the temperature detection value.

Furthermore, the oscillator 1A includes the voltage stabilizer circuit 6 constituted of an LDO (low voltage dropout regulator). A voltage from an external power source 60 is stabilized with the voltage stabilizer circuit 6, and the stabilized voltage is supplied to the LSI 300 and the heater circuit 50.

Figure 4:
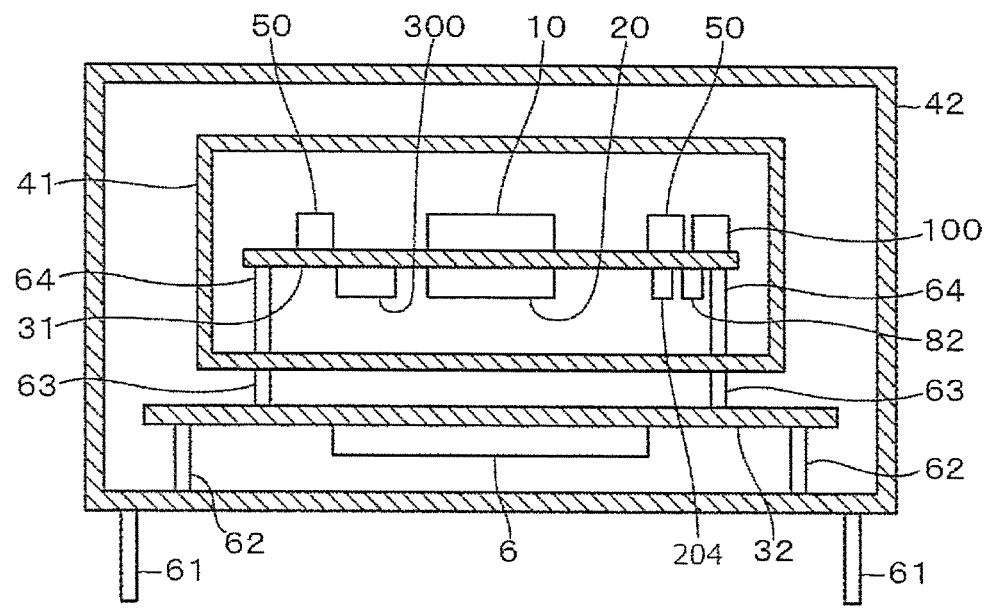
FIG. 4 is a longitudinal sectional side view illustrating a configuration of an oscillator.
Figure 5:
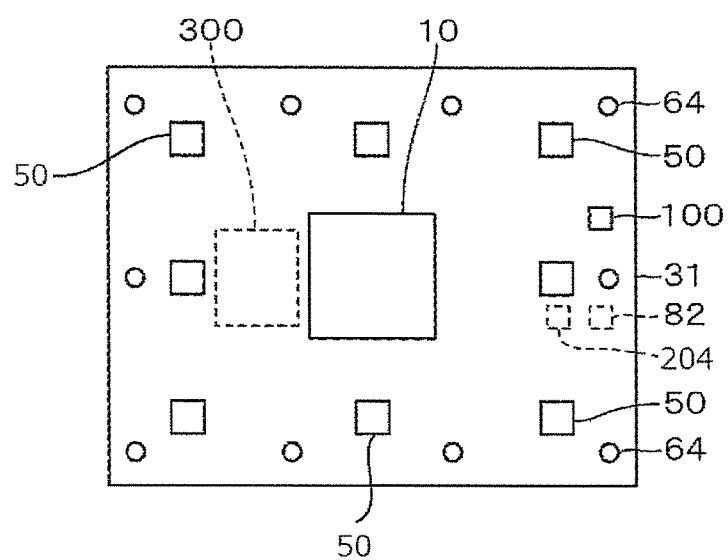
FIG. 5 is a top surface schematic diagram illustrating a main part of the oscillator.

FIG. 4 is a longitudinal sectional side view of the whole oscillator 1A, and FIG. 5 is a top surface schematic diagram of a first substrate 31, which will be described later, in the oscillator 1A. A three-dimensional configuration of the oscillator 1A will be described using these diagrams.

The oscillator 1A includes, for example, a square-shaped second container 42 that corresponds to an external container and conductive pins 61. The second container 42 internally supports a second substrate 32 in a state of floating with conductive pins 62 that are supporting parts extending upward from a bottom portion of the second container 42. From the second substrate 32, conductive pins 63, which are supporting parts, are extending upward, and a first container 41, which corresponds to an internal container, is supported with the conductive pins 63. That is, the first container 41 is supported in the. state of floating from the second substrate 32

The first container 41 internally supports the first substrate 31 in the state of floating with conductive pins 64 that are supporting parts extending upward from a bottom portion of the first container 41. Assume that a surface, on the first substrate 31, on a side opposite from a surface on a side where the second substrate 32 is disposed is referred to as a top surface (one surface), the crystal resonators 10 and 20 are respectively disposed on the top surface side (one side surface) and a lower surface side (other side surface) in a center portion of the first substrate 31. On the top surface side of the first substrate 31, a plurality of heater circuits 50 are disposed inside with respect to the pins 64 so as to surround the first crystal resonator 10, and a third crystal resonator 100 is disposed outside with respect to a group of the heater circuits 50. The third crystal resonator 100 is a crystal resonator included in the voltage control oscillator 205.

On the lower surface side of the first substrate 31, the LSI 300 is disposed inside with respect to positions corresponding to where the group of the heater circuits 50 is. The loop filter 204 and the external memory 82 are disposed at positions apart from the positions corresponding to where the group of the heater circuits 50 is. The voltage stabilizer circuit 6 is disposed on the lower surface on the second substrate 32 (a surface on the opposite side of a surface facing the first container 41).

In the oscillator of such a configuration, an external temperature is detected as a value $\Delta F$ that corresponds to a frequency difference between the first crystal resonator 10 and the second crystal resonator 20. The output power of the heater circuit 50 is controlled on the basis of this $\Delta F$ so as to maintain the temperature of the first crystal resonator 10 at the setting temperature. A setting value that corresponds to a frequency of a reference clock in the PLL circuit unit 200 is also corrected on the basis of $\Delta F$. Furthermore, the setting value is further corrected as described above on the basis of the output value of the PI calculation unit 54 corresponding to a control value of the heater circuit 50.

Even though a supply voltage of the power source 60 varies, the voltage stabilizer circuit 6 stabilizes the voltage, and the stabilized voltage is supplied to the heater circuit 50, the PLL circuit unit 200, and the DSP block 5.

According to the above-described embodiment, in the oscillator 1A, which is an OCXO, the crystal resonators 10 and 20, the oscillator circuits 1 and 2, the temperature detector 53, and the heater circuit 50 are disposed inside the first container 41, which is supported in the state of floating inside the second container 42, while the voltage stabilizer circuit 6 for stabilizing the supply voltage supplied to the heater circuit 50 is disposed at a position apart from the first container 41 inside the second container 42. Therefore, the voltage supplied to the heater circuit 50 is stabilized. The voltage stabilizer circuit 6 is less likely to be affected by heat generation of the heater circuit 50, thereby obtaining a stable oscillation frequency output regardless of the environmental temperature in which the oscillator 1A is placed.

According to the above-described embodiment, the voltage that is stabilized at the voltage stabilizer circuit 6 is supplied to both the group of the heater circuits 50 and the LSI 300, however, a circuit that supplies the voltage to the group of the heater circuits 50 and a circuit that supplies the voltage to the LSI 300 may be different. In this case, the configuration where the voltage stabilizer circuit 6 is disposed only in the circuit that supplies the voltage to the group of the heater circuits 50 may be employed.

Furthermore, according to the above-described embodiment, the voltage stabilizer circuit 6 is used to supply the stabilized voltage to the group of the heater circuits 50, however, as an alternative of the voltage stabilizer circuit 6, a switching power source may be used. The first crystal resonator 10 and the second crystal resonator 20 may be disposed in a container that commonly houses the crystal resonators disposed on the top surface side of the first substrate 31, or the first crystal resonator 10 and the second crystal resonator 20 may be formed in respective areas on a common quartz crystal piece that is divided into the areas.

According to the above-described embodiment, the frequency difference is measured by using a plurality of crystal resonators to detect a temperature, however, as an alternative of these crystal resonators, a configuration that detects the temperature using a thermistor also achieves a similar effect. Furthermore, the oscillator of the present invention is not limited to the circuit configuration in FIG. 1, and for example, a voltage control oscillator may be used instead of the PLL circuit unit 200 in the latter part of the addition unit 58. In this case, an output of the addition unit 58 is used as a control voltage of the voltage control oscillator.

Figure 6:
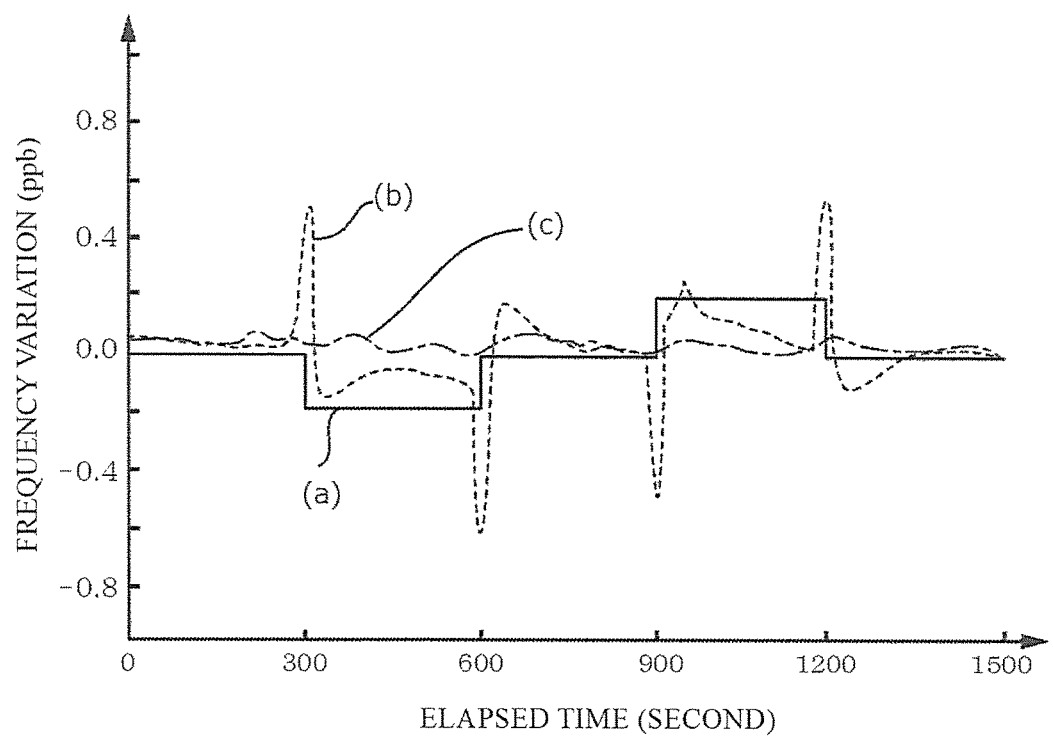
FIG. 6 is a graph illustrating experimental results of an oscillator of the present invention and an oscillator of a comparative example.

FIG. 6 illustrates a test result performed to confirm the effects of the invention. In the circuit in FIG. 1, an output frequency of the voltage control oscillator 205 is set to 20 MHz, and a supply voltage is varied by $\pm 1\%$ in a rectangular shape. In FIG. 6, the vertical axis takes a variation rate of the output frequency of the voltage control oscillator 205 and the horizontal axis takes the elapsed time. For ease of understanding, a solid line a is superimposed to indicate the voltage transition. A dotted line b indicates a characteristic where the voltage stabilizer circuit 6 is not disposed, and a chain line c indicates a characteristic where the above-described embodiment is used. When the voltage stabilizer circuit 6 is not disposed, the maximum frequency variation is $\pm 0.5$ ppb, whereas in the above-described embodiment, the maximum frequency variation is $\pm 0.1$ ppb. Therefore, according to the above-described embodiment, it is understood that the output frequency is stabilized.

The invention claimed is:
1. An oscillator including an oscillator circuit connected to a plurality of crystal resonators, and a plurality of heater circuits for stabilizing a temperature of an atmosphere in which the crystal resonators are placed, the oscillator comprising:

a first substrate, supported in a inner most container with a first supporting member from an inner wall of the inner most container;
a temperature detector, configured to detect a temperature inside the innermost container, and the heater circuits is controlled based on a temperature detection value of the temperature detector, and the crystal resonators, the oscillator circuit, the temperature detector and the heater circuits being each disposed on the first substrate and inside the inner most container;
a outer most container, housing the inner most container in an internal space of the outer most container, the outer most container supporting the inner most container from an inner wall of the outer most container via a supporting portion; and
a voltage stabilizer circuit, disposed apart from the inner most container in the outer most container, the voltage stabilizer circuit stabilizing a supply voltage supplied to the heater circuits.

2. The oscillator according to claim 1, wherein
the voltage stabilizer circuit is disposed on a second substrate supported with the supporting portion.

3. The oscillator according to claim 2, wherein
the voltage stabilizer circuit is disposed on a surface on an opposite side of the inner most container on the second substrate.

4. The oscillator according to claim 1, wherein
a difference between a temperature detection value of the temperature detector and a temperature setting value is used as a control value of the heater circuit, and
a value multiplied the difference with a coefficient is used as a correction value of a frequency setting value of the oscillator.

* * * * *